US011563408B2

(12) United States Patent
Rexberg et al.

(10) Patent No.: US 11,563,408 B2
(45) Date of Patent: Jan. 24, 2023

(54) ACTIVE ARRAY ANTENNA LINEARIZATION (71) Applicant: Telefonaktiebolaget LM Ericsson (publ), Stockholm (SE)

(72) Inventors: Leonard Rexberg, Hässelby (SE); Göran Nilsson, Hisings Backa (SE); Tomas Andersson, Vallentuna (SE); Pär Holmgren, Tullinge (SE); Anders Martinsson, Gothenburg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/293,676

(22) PCT Filed: Nov. 13, 2018

(86) PCT No.: PCT/EP2018/081043
§ 371 (c)(1),
(2) Date: May 13, 2021

(87) PCT Pub. No.: WO2020/098916
PCT Pub. Date: May 22, 2020

(65) Prior Publication Data
US 2022/0006430 A1  Jan. 6, 2022

(51) Int. Cl.
*H03F 1/32*  (2006.01)
*H04B 1/04*  (2006.01)
(Continued)

(52) U.S. Cl.
CPC ......... *H03F 1/3258* (2013.01); *H03F 1/3247* (2013.01); *H04B 1/0475* (2013.01);
(Continued)

(58) Field of Classification Search
CPC ........ H03F 1/3258; H03F 1/3247; H03F 3/68; H03F 220/451; H04B 1/0475; H04L 27/368
(Continued)

(56) References Cited

U.S. PATENT DOCUMENTS 7,782,132 B2   8/2010   Plotnik et al.
8,699,620 B1   4/2014   Wu
(Continued)

FOREIGN PATENT DOCUMENTS

EP   2629431 B1   10/2017
EP   3255799 A1   12/2017
(Continued)

OTHER PUBLICATIONS

Non-Final Office Action mailed for U.S. Appl. No. 16/617,895, dated Apr. 6, 2020, 10 pages.
(Continued)

*Primary Examiner* — Kevin M Burd
(74) *Attorney, Agent, or Firm* — Withrow & Terranova, PLLC (57) ABSTRACT Systems and methods for linearizing a radio system are disclosed. In some embodiments, a radio system comprises an antenna array, transmit branches comprising respective power amplifiers, a predistortion subsystem comprising predistorters for the transmit branches respectively, a receive antenna element, a transmit observation receiver having an input coupled to the receive antenna element, and an adaptor. The predistorters predistort respective transmit signals to provide predistorted transmit signals to the respective transmit branches for transmission via respective active antenna elements in the antenna array. The transmit observation receiver is operable to receive, via the receive antenna element, a combined receive signal due to coupling between (Continued)

the receive antenna element and the active antenna elements. The adaptor is operable to generate a combined reference signal based on the transmit signals and configure predistortion parameters input to the predistorters based on the combined reference signal and the combined receive signal.

5 Claims, 5 Drawing Sheets

(51) Int. Cl.
*H04L 27/36* (2006.01)
*H03F 3/68* (2006.01)

(52) U.S. Cl.
CPC .............. *H04L 27/368* (2013.01); *H03F 3/68* (2013.01); *H03F 2200/451* (2013.01)

(58) Field of Classification Search
USPC ........................................................ 375/297
See application file for complete search history.

(56) References Cited

U.S. PATENT DOCUMENTS

| | | | |
|---|---|---|---|
| 8,803,603 | B2 | 8/2014 | Wimpenny |
| 10,225,112 | B1* | 3/2019 | Doane ............... H04L 25/03343 |
| 10,979,090 | B2 | 4/2021 | Rafique |
| 2008/0146168 | A1 | 6/2008 | Jesson et al. |
| 2008/0159435 | A1 | 7/2008 | Cohen |
| 2010/0093282 | A1 | 4/2010 | Martikkala et al. |
| 2010/0166110 | A1 | 7/2010 | Neumann et al. |
| 2010/0311353 | A1 | 12/2010 | Teillet et al. |
| 2010/0311360 | A1 | 12/2010 | Huang et al. |
| 2010/0321107 | A1 | 12/2010 | Honcharenko |
| 2011/0201287 | A1 | 8/2011 | Pratt et al. |
| 2011/0235734 | A1 | 9/2011 | Kenington |
| 2011/0235749 | A1* | 9/2011 | Kenington ............ H03F 1/3247 375/296 |
| 2012/0021691 | A1 | 1/2012 | Boe et al. |
| 2012/0328050 | A1 | 12/2012 | Bai et al. |
| 2013/0094550 | A1 | 4/2013 | Coan et al. |
| 2015/0103952 | A1 | 4/2015 | Wang et al. |
| 2015/0381220 | A1 | 12/2015 | Gal et al. |
| 2016/0285485 | A1 | 9/2016 | Fehri et al. |
| 2016/0308577 | A1 | 10/2016 | Molina et al. |
| 2017/0134210 | A1 | 5/2017 | Eitan et al. |
| 2017/0163217 | A1 | 6/2017 | Bonebright et al. |
| 2018/0026586 | A1 | 1/2018 | Carbone et al. |
| 2018/0167091 | A1 | 6/2018 | Pratt et al. |
| 2018/0287569 | A1 | 10/2018 | Xu et al. |
| 2018/0316367 | A1 | 11/2018 | Johansson et al. |
| 2019/0089389 | A1* | 3/2019 | Gutman ................ H03F 1/3247 |
| 2019/0238204 | A1 | 8/2019 | Kim et al. |
| 2020/0028476 | A1 | 1/2020 | Kim et al. |
| 2020/0145033 | A1 | 5/2020 | Rafique |

FOREIGN PATENT DOCUMENTS

| | | |
|---|---|---|
| WO | 2007054609 A1 | 5/2007 |
| WO | 2017198288 A1 | 11/2017 |
| WO | 2018166575 A1 | 9/2018 |
| WO | 2018219466 A1 | 12/2018 |

OTHER PUBLICATIONS

Final Office Action for U.S. Appl. No. 16/617,895, dated Sep. 22, 2020, 13 pages.
Notice of Allowance for U.S. Appl. No. 16/617,895, dated Dec. 9, 2020, 9 pages.
Examination Report for European Patent Application No. 17728165.6, dated Sep. 29, 2020, 6 pages.
International Search Report and Written Opinion for International Patent Application No. PCT/EP2017/063355, dated Jan. 16, 2018, 10 pages.
International Search Report and Written Opinion for International Patent Application No. PCT/EP2018/081043, dated Jun. 27, 2019, 9 pages.
Non-Final Office Action for U.S. Appl. No. 17/220,541, dated Nov. 12, 2021, 15 pages.
Notice of Allowance for U.S. Appl. No. 17/220,541, dated Apr. 27, 2022, 8 pages.
Examination Report No. 1 for Australian Patent Application No. 2018449223, dated May 13, 2022, 3 pages.
Examination Report for Canadian Patent Application No. 3119673, dated Jul. 4, 2022, 4 pages.
Examination Report for European Patent Application No. 18807005.6, dated Sep. 14, 2022, 7 pages.

* cited by examiner

FIG. 1 for k = 1:K
r = X · ß
y = Y · ß
$a_{k+1} = a_k + \eta \cdot MAT_k \setminus (r - y)$
end

ACTIVE ARRAY ANTENNA LINEARIZATION

This application is a 35 U.S.C. § 371 national phase filing of International Application No. PCT/EP2018/081043, filed Nov. 13, 2018, the disclosure of which is incorporated herein by reference in its entirety.

TECHNICAL FIELD

The present disclosure relates to linearization of a power amplifier in a radio system and more specifically relates to linearization of multiple power amplifiers coupled to multiple active antenna elements in a radio system.

BACKGROUND

Any form of Radio Frequency (RF) transmit unit will have restrictions on how much extra spectrum emission is allowed outside its own transmit bandwidth. Different requirements may be placed on the RF transmit unit depending on where in the spectrum domain that the transmit bandwidth of the RF transmit unit appears. As an example, in-band emissions and out-of-band emissions are two of the many possible requirements. Mostly, out-of-band emissions can be effectively controlled by applying RF filters. Also, filtering of the in-band spectrum might actually be possible from a purely theoretical point of view. However, the filtering of the in-band spectrum is usually never considered because such filtering would severely limit the use of the hardware equipment to a specific carrier frequency and could not be retuned even within the RF transmit unit's operating frequency band. As such, since the power amplifier of the RF transmit unit is usually responsible for the emissions, designers typically try to linearize the amplifier instead.

Linearization can be performed in several ways, both in analog form and in digital form. In analog form, linearization is usually performed at RF, but could possibly also be made at low frequency or Intermediate Frequency (IF). Digital linearization is usually performed at digital baseband. In its simplest form, digital linearization predistorts the signal before it enters the power amplifier in such a way that the predistortion more or less cancels out the distortion produced by the power amplifier. This technique is called Digital Predistortion (DPD). However, feed forward approaches also exist where the distortion caused by the power amplifier is cancelled directly at the output of the power amplifier. Feed forward approaches have drawbacks both in terms of design complexity and inherently weak power efficiency.

It is clear that in most cases some kind of linearization is often needed to be implemented. In general, there is a one-to-one mapping between predistorters and amplifiers. That is, hardware for a specific predistorter is implemented and designed for each amplifier. In conjunction to the activator functionality of the predistorter itself, a feedback system is usually designed and implemented to keep track of the actual output signal and to be able to react to changes in the system that may need changes in the activator in turn.

Issues arise when extending DPD to so-called Active Antenna System (AAS) and Multiple Input Multiple Output (MIMO) (e.g., massive MIMO) systems where there are many active antenna radio branches. Today, the number of antenna branches, and thus the number of power amplifiers, is on the order of hundreds. Using existing DPD technology, a separate predistorter and feedback loop is needed for each separate power amplifier. For each power amplifier, the feedback loop uses a linearizer algorithm that tries to minimize the extra intermodulation spectrum that is produced by the power amplifier by in turn configuring the respective predistorter to add an appropriate amount of signal distortion to the input.

A typical implementation includes a predistorter, an amplifier, a coupler, a receiver that is dedicated to the distortion detection, and an adaptor that adaptively configures the predistorter to minimize the distortion in the feedback signal. The coupler takes a small amount of the RF signal, which is fed back to the adaptor via the receiver where it is compared to the original signal. One example would be to feed the feedback signal through an Analog to Digital Converter (ADC) and then transfer it back to digital complex baseband by means of an In-phase and a Quadrature phase component (I and Q) where it is compared to the original signal. The adaptor applies an algorithm that typically tries to minimize the difference between the original signal and the output signal from the amplifier except for possibly a gain factor and an optional phase+time lag difference. This kind of loop is then repeated for every branch in the active antenna radio system. This results in a massive amount of hardware and processing for linearization.

Particularly in radio systems such as AAS and MIMO systems having a large number of active antenna radio branches, there is a need to drastically reduce the amount of hardware needed to simultaneously linearize many amplifiers while at the same time reduce signal processing needs.

One way of reducing the hardware needed is to use one of the receive branches as a feedback system for the linearization, as described in [1]. That is, no special receptor for the feedback signal has to be implemented. This will work if the type of communication system is a Time Domain Division (TDD), but not for a Frequency Domain Division (FDD) system. Moreover, special control signaling would be needed to switch some of the branches in transmit mode, while one or possibly more branches would be set into receive mode.

Linearization of a full active array antenna requires careful design and calls for any means by which complexity and hardware need can be reduced.

SUMMARY

Systems and methods for linearizing a radio system comprising an antenna array are disclosed. In some embodiments, a radio system comprises an antenna array comprising a plurality of active antenna elements, a plurality of transmit branches comprising a respective plurality of power amplifiers, a predistortion subsystem comprising a plurality of predistorters for the plurality of transmit branches respectively, a receive antenna element, a transmit observation receiver having an input coupled to the receive antenna element, and an adaptor. The predistorters are operable to predistort respective transmit signals to provide predistorted transmit signals and provide the predistorted transmit signals to the respective transmit branches. The transmit branches are operable to transmit the predistorted transmit signals via the respective active antenna elements. The transmit observation receiver is operable to receive, via the receive antenna element, a combined receive signal that corresponds to a combination of the transmit signals received at the receive antenna element due to coupling between the receive antenna element and the active antenna elements. The adaptor is operable to generate a combined reference signal based on the transmit signals such that the combined reference signal models the combined receive signal and configure predistortion parameters input to the predistorters that define predistortion provided by the predistorters based on the combined reference signal and the combined receive signal. In this manner, linearization for each of the branches of the radio system can be performed without the need for couplers for each antenna element and with low processing complexity.

In some embodiments, the adaptor is operable to configure the predistortion parameters input to the predistorters that define predistortion provided by the predistorters based on the combined reference signal, the combined receive signal, and known complex valued attenuation factors that define the coupling from the active antenna elements to the receive antenna element. Further, in some embodiments, the predistortion parameters are a common set of predistortion coefficients for the predistorters. In some embodiments, the predistortion parameters are an estimated predistortion coefficient vector ($\alpha_{k+1}$) that defines a common set of predistortion coefficients for the predistorters and, in order to configure the predistortion parameters, the adaptor is further configured to compute the estimated predistortion coefficient vector, $\alpha_{k+1}$, in accordance with:

$$\alpha_{k+1} = \alpha_k + \eta \cdot M_k^+ \cdot \left[ \left( \sum_{n=1}^{N} \beta_n \cdot x_n \right) - y_k \right]$$

where
  $\alpha_k$ is a prior set of predistortion parameters at iteration k for the plurality of predistorters used to generate the plurality of predistorted transmit signals;
  $\eta$ is a scaling convergence factor;
  $\beta_n$ is a coupling factor between the n-th active antenna element and the receive antenna element;
  $x_n$ is the transmit signal that is predistorted by the respective predistorter to provide the predistorted transmit signal for the transmit branch for the n-th active antenna element;
  $y_k$ is the combined receive signal; and $M_k^+ = (M_k^H \cdot M_k)^{-1} \cdot M_k^H$ where $M_k = [y_k, y_k \cdot |y_k|^2, y_k \cdot |y_k|^4 \cdots \cdots]$.

In some other embodiments, the predistortion parameters comprise a separate set of predistortion coefficients for each of the predistorters.

In some embodiments, the adaptor is operable to configure the predistortion parameters input to the predistorters that define predistortion provided by the predistorters based on the combined reference signal, the combined receive signal, and one or more estimated parameters that take into consideration unknown complex valued attenuation factors that define a coupling from the active antenna elements to the receive antenna element. In some embodiments, the predistortion parameters are a common set of predistortion coefficients for the predistorters. In some other embodiments, the predistortion parameters comprise a separate set of predistortion coefficients for each of the predistorters.

In some embodiments, the receive antenna element is a dedicated antenna element for the transmit observation receiver.

Embodiments of a method of operation of a radio system are also disclosed. In some embodiments, a method of operation of a radio system to linearize the radio system comprises predistorting a plurality of transmit signals via a respective plurality of predistorters of the radio system to thereby provide a plurality of predistorted transmit signals and transmitting the predistorted transmit signals via respective active antenna elements in an antenna array of the radio system. The method further comprises receiving a combined receive signal via a receive antenna element and a transmit observation receiver of the radio system, wherein the combined receive signal corresponds to a combination of the transmit signals received at the dedicated antenna due to coupling between the receive antenna element and the active antenna elements. The method further comprises generating a combined reference signal based on the transmit signals such that the combined reference signal models the combined receive signal and configuring, based on the combined reference signal and the combined receive signal, predistortion parameters input to the predistorters that define predistortion provided by the predistorters.

In some embodiments, configuring the predistortion parameters comprises configuring the predistortion parameters based on the combined reference signal, the combined receive signal, and known complex valued attenuation factors that define a coupling from the active antenna elements to the receive antenna element. In some embodiments, the predistortion parameters are a common set of predistortion coefficients for the predistorters. In some embodiments, the predistortion parameters are an estimated predistortion coefficient vector ($\alpha_{k+1}$) that defines a common set of predistortion coefficents for the plurality of predistorters and configuring the predistortion parameters comprises computing the estimated predistortion coefficient vector ($\alpha_{k+1}$) in accordance with:

$$\alpha_{k+1} = \alpha_k + \eta \cdot M_k^+ \cdot \left[ \left( \sum_{n=1}^{N} \beta_n \cdot x_n \right) - y_k \right]$$

where
  $\alpha_k$ is a prior set of predistortion parameters at iteration k for the plurality of predistorters used to generate the plurality of predistorted transmit signals;
  $\eta$ is a scaling convergence factor;
  $\beta_n$ is a coupling factor between the n-th active antenna element and the receive antenna element;
  $x_n$ is the transmit signal that is predistorted by the respective predistorter to provide the predistorted transmit signal for a transmit branch for the n-th active antenna element;
  $y_k$ is the combined receive signal; and $M_k^+ = (M_k^H \cdot M_k)^{-1} \cdot M_k^H$ where $M_k = [y_k, y_k \cdot |y_k|^2, y_k \cdot |y_k|^4 \cdots \cdots]$.

In some other embodiments, the predistortion parameters comprise a separate set of predistortion coefficients for each of the predistorters.

In some embodiments, configuring the predistortion parameters comprises configuring the predistortion parameters based on the combined reference signal, the combined receive signal, and one or more estimated parameters that take into consideration unknown complex valued attenuation factors that define a coupling from the plurality of active antenna elements to the receive antenna element. In some embodiments, the predistortion parameters are a common set of predistortion coefficients for the predistorters. In some other embodiments, the predistortion parameters comprise a separate set of predistortion coefficients for each of the predistorters.

In some embodiments, the receive antenna element is a dedicated antenna element for the transmit observation receiver.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Linearization of a full active array antenna requires careful design and calls for any means by which complexity and hardware need can be reduced. In this regard, there are some existing solutions that try to minimize the necessary hardware by re-using the same linearizer feedback receiver by switching it around all of the amplifier branches which have their own coupler interface [2]. This would usually be called Transmit Observation Receiver (TOR) sharing. TOR sharing requires some clever scheduler, the couplers, and a switch network. A method [3] is described that utilizes one common linearizer for all antenna branches in an active array antenna. It takes the summed-up power in a "power sensor" and uses that information to control the biasing of the different amplifiers, the gain of the amplifiers, and also the shaping of the common linearizer as to give linearization.

The problem with the existing solution described in [2] is that it requires a significant amount of hardware in terms of Radio Frequency (RF) couplers and possibly transmission line routing on the antenna board itself, and it requires full signal processing capability to cope with a full set of linearizers, one for each branch of the antenna array. If it is not the case of TOR sharing, a separate TOR has to be implemented for each antenna branch. In addition, there would be a signal processing loop for each antenna branch with its separate algorithm controlling an individual linearizer.

The solution in [3] uses a power detector and is able to control power settings of the different amplifiers, together with the individual branch gain and also the shape of the common linearizer. This solution lacks the ability to linearize a multitude of beams in the array antenna. It has only one linearizer for all of the active antenna branches at the same time. If digital beamforming is to be used, then individual linearizers have to be used for each amplifier in the active array antenna. An active array antenna supporting several beams at the same time (digital beamforming) needs to have a linearizer dedicated to each amplifier branch.

These linearizers could be all the same, e.g., if all amplifiers are the same, or may be differently shaped if each amplifier is to be linearized separately. The algorithm for the whole multitude of linearizers may be given the task of picking some average parameter set for the linearizer, or it may be given the task of individually linearizing each amplifier.

Systems and methods are disclosed herein that drastically reduce the amount of hardware needed to simultaneously linearize multiple amplifiers and at the same time save signal processing needs in the same order of pace. The systems and methods disclosed herein have a clear application towards implementing linearization of an active array antenna where all of the antenna elements are separately driven by individual power amplifiers.

More specifically, in some embodiments a radio system is provided that includes an antenna array (e.g., an Active Antenna System (AAS)) including multiple antenna elements, transmit branches coupled to the antenna elements respectively, a TOR (also referred to herein as a linearizer receiver), and a receive antenna element (e.g., an additional antenna element that is dedicated for the TOR). The antenna elements are referred to herein as "active antenna elements" because the respective transmit branches include Power Amplifiers (PAs). The receive antenna element may be positioned arbitrarily somewhere nearby the antenna array. In addition, the radio system includes a predistortion subsystem that includes a separate digital predistorter or linearizer for each transmit branch and an adaptor that configures predistortion parameters input to the digital predistorters to control the predistortion applied by the digital predistorters.

In operation, transmit signals for the active antenna elements are predistorted by the respective digital predistorters to provide predistorted transmit signals, which are provided to the respective transmit branches for transmission via the respective active antenna elements. Due to coupling between the active antenna elements and the receive antenna element, the TOR receives a combined receive signal via the receive antenna element. This combined signal is a combination of the transmit signals transmitted via the active antenna elements. The adaptor generates a combined reference signal based on the transmit signals such that the combined reference signal models (i.e., emulates) the combined receive signal received via the TOR. The adaptor generates (e.g., updates) the predistortion parameters provided to the digital predistorters based on the combined receive signal and the combined reference signal. For example, the combined receive signal and the combined reference signal may be compared after one or both has been adjusted such that the two signals are time and phase aligned, e.g., to determine an error. An error minimization technique (e.g., Least Mean Squares (LMS)) can then be used to update the predistortion parameters such that the error between the combined receive signal and the combined reference signal is minimized. The difference between the emulated signal combination and the actually measured signal would be a figure of merit of the algorithm convergence. Because the radio system uses a separate linearizer for each transmit branch, rather than a common linearizer, the radio system is able to perform simultaneous linearization for multiple beams at the same time, while also reducing processing complexity.

While not being limited to or by any particular advantages, embodiments of the present disclosure provide a number of advantages. For example, the embodiments disclosed herein avoid the need for RF couplers on each antenna (amplifier) branch and an RF routing network from the couplers down to the TOR receiver(s). As such, the amount of hardware needed is significantly reduced. Further, the signal processing needed is reduced to the equivalent of what is needed for a single linearizer loop. Embodiments disclosed herein also provide an efficient way to linearize simultaneous beams by so-called digital beamforming by the same hardware.

The embodiments disclosed herein provide a solution for applying linearization to a large active antenna array that promises a large reduction in implementation cost, while also reducing the complexity of the linearization system to a large extent.

Another advantage of some embodiments of the present disclosure is that an existing linearizer solution in terms of the algorithm by which an optimum solution may be found for single antenna linearization may be re-used. So, there is no need for designing any new linearizer algorithm. Rather, new inputs to an existing linearization algorithm are used to thereby obtain an output having a new combined meaning.

Figure 1:
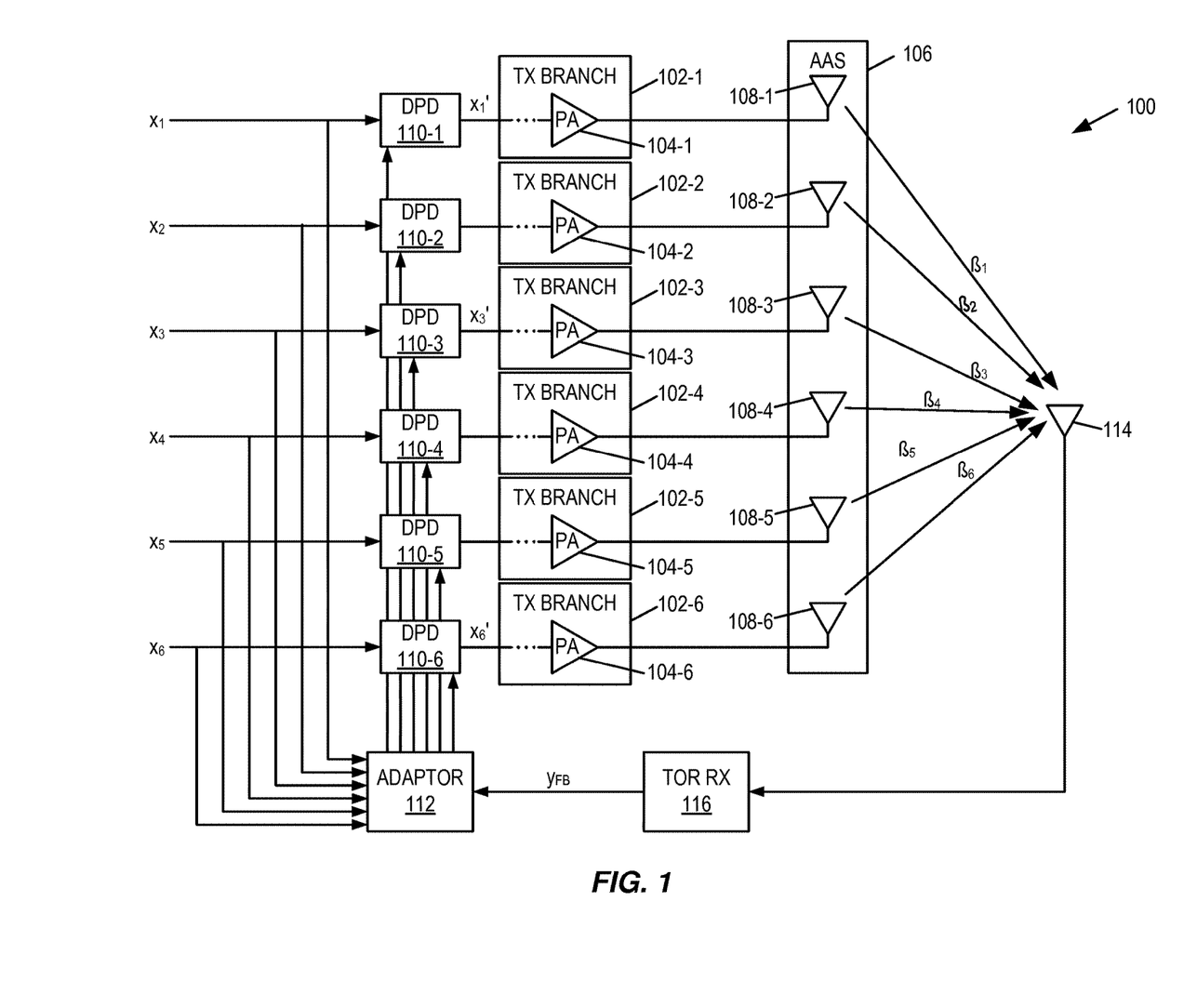
FIG. 1 illustrates a radio system that provides linearization in accordance with some embodiments of the present disclosure.

FIG. 1 illustrates one example of a radio system 100 in accordance with some embodiments of the present disclosure. The radio system 100 may be, for example, implemented in a base station of a cellular radio access network (e.g., a Fifth Generation (5G) New Radio (NR) radio access network). As illustrated, the radio system 100 includes multiple transmit branches 102-1 through 102-6 (also referred to herein as antenna branches) including respective PAs 104-1 through 104-6 coupled to an antenna array 106, which in this example is an AAS. The PAs 104-1 through 104-6 of the transmitter branches 102-1 through 102-6 are coupled to respective antenna elements 108-1 through 108-6. The antenna elements 108-1 through 108-6 are also referred to herein as active antenna elements 108-1 through 108-6. While not illustrated, the transmit branches 102-1 through 102-6 may include additional components such as, e.g., Digital to Analog Converters (DACs), upconverters, filters, and/or the like. Note that the transmit branches 102-1 through 102-6 are generally referred to herein collectively as transmit branches 102 and individually as transmit branch 102. Likewise, the PAs 104-1 through 104-6 are generally referred to herein collectively as PAs 104 and individually as PA 104, and the antenna elements 108-1 though 108-6 are generally referred to herein collectively as antenna elements 108 and individually as antenna element 108. Also note that while there are six transmit branches 102 and six antenna elements 108 in this example, the number of transmit branches 102 and antenna elements 108 can be any integer number greater than or equal to 2.

The radio system 100 also includes a linearization subsystem, which in this example is a Digital Predistortion (DPD) subsystem. Note that while DPD is used to provide linearization in many of the example embodiments described herein, it should be noted that other types of linearization may be used (e.g., analog predistortion). The DPD subsystem includes separate DPD predistorters 110-1 through 110-6 (also referred to herein as DPD actuators) for the respective transmit branches 102-1 though 102-6 and an adaptor 112, which may be implemented in hardware or a combination of hardware and software. A feedback loop provides a feedback signal ($y_{FB}$) that is used by the adaptor 112 to generate (e.g., update) predistortion parameters input into the DPD predistorters 110 based on the feedback signal.

In this example, it is assumed that all of the PAs 104 have exactly the same non-linear behavior. In this case, all of the DPD predistorters 110 are configured with the same set of predistortion parameters (e.g., the same set of complex valued predistortion coefficients). Having a separate DPD predistorter 110 for each transmit branch 102 enables each PA 104 to be provided with a different signal that is to be amplified. Importantly, it should be understood that the transmit signals may be all different, and it is the individual PAs 104 that are to be linearized and not the transmit signals themselves. So, regardless of the transmit signals, the predistortion is only changed if the non-linear behavior of the PAs 104 for some reason changes.

The feedback loop includes a receive antenna element 114 (also referred to herein as a feedback antenna element) and a TOR 116. The TOR 116 includes typical receiver components such as, e.g., a Low Noise Amplifier (LNA), filter(s), downconversion circuitry, and in some cases Analog to Digital Converter (ADC) circuitry. Preferably, the receive antenna element 114 is a dedicated antenna element, i.e., an antenna element that is dedicated for the TOR 116. The receive antenna element 114 is positioned near the antenna elements 108.

In operation, transmit signals $x_1$ through $x_6$ for the transmit branches 102-1 through 102-6 for the respective active antenna elements 108-1 through 108-6 in the antenna array 106 are provided to the respective DPD predistorters 110-1 through 110-6. The DPD predistorters 110-1 through 110-6 predistort the transmit signals $x_1$ through $x_6$ to thereby provide respective predistorted transmit signals $x_1'$ through $x_6'$, which are provided to the respective transmit branches 102-1 through 102-6 for transmission via the active antenna elements 108-1 through 108-6, respectively.

During transmission of the predistorted transmit signals $x_1'$ through $x_6'$, the TOR 116 outputs a feedback signal ($y_{FB}$) that is received via the receive antenna element 114 due to a coupling (i.e., an antenna-to-antenna coupling) from each of the active antenna elements 108-1 through 108-6 to the receive antenna element 114. The feedback signal ($y_{FB}$) is referred to herein as a combined receive signal or a combined feedback signal because it is the combination of the predistorted transmit signals $x_1'$ through $x_6'$ transmitted via the active antenna elements 108-1 through 108-6 received at the receive antenna element 114 due to the coupling from each of the active antenna elements 108-1 through 108-6 to the receive antenna element 114. These couplings are denoted by respective coupling parameters $\beta_1$ through $\beta_6$. Importantly, these couplings do not require hardware couplers and, as such, hardware is reduced as compared to existing solutions that require hardware couplers for each antenna element. In this example, the coupling parameters $\beta_1$ through $\beta_6$ are known. For example, the coupling parameters $\beta_1$ through $\beta_6$ may have been previously measured during calibration or estimated based on a physical distance between the antenna elements 108 and the receive antenna element 114 (e.g., a Look Up Table (LUT) may be populated with estimated values for the different antenna elements 108 such that the needed values can be obtained from the LUT as needed).

The adaptor 112 generates a combined reference signal from the transmit signals $x_1$ through $x_6$ such that the combined reference signal models (i.e., emulates) the combined receive signal (i.e., the feedback signal $y_{FB}$). The adaptor 112 utilizes an adaption scheme, or algorithm, to generate (e.g., update) the predistortion parameters input to the DPD predistorters 110 based on the combined receive signal and the combined reference signal. More specifically, in some embodiments, after time and phase aligning the combined reference signal and the combined receive signal, an error between the combined receive signal and the combined reference signal is determined. A minimization scheme (e.g., LMS) is utilized to generate the predistortion parameters such that this error is minimized.

In this manner, a single receive antenna 114 and a single TOR 116 are used to obtain the combined receive signal that is representative of all of the transmit signals that are output by the PAs 104 in the active transmit branches (i.e., the transmit branches 102 that are coupled to the active antenna elements 108). Further, a single adaptor 112 (i.e., a single adaptation algorithm) can be used to generate the predistortion parameters input into all of the DPD predistorters 110. In other words, a single adaptor 112 is used for all PAs 104 for all of the antenna elements 108 in the antenna array 110.

Figure 2:
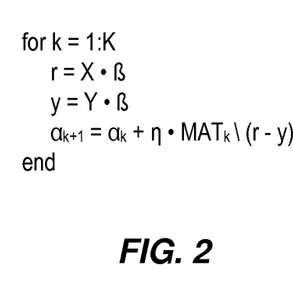
FIG. 2 illustrates an adaptation scheme utilized by the adaptor in the radio system of FIG. 1 in accordance with some embodiments of the present disclosure.

FIG. 2 illustrates the adaptation scheme implemented by the adaptor 112 in accordance with some embodiments of the present disclosure. More specifically, the adaptation scheme illustrated in FIG. 2 is an LMS algorithm to minimize the error between the combined reference signal and the combined receive signal, where 'y' is the combined receive signal (denoted as $y_{FB}$ in FIG. 1), 'r' is the combined reference signal, 'α' is the sought predistortion parameters, 'MAT' is the derivative matrix, and 'η' is the scaling convergence factor. The adaptation scheme is an iterative scheme where the error between the combined receive signal and the combined reference signal is minimized in each step of the iteration. The speed of convergence is controlled by essentially evaluating the multi-dimensional derivative (MAT) and in addition to the scaling factor η. By starting with a guess of the solution (e.g., some default initial set of predistortion parameters), the solution may be iteratively improved by this search algorithm which is actually an implementation of Newton's search method. The algorithm gives an LMS solution to the problem. The predistortion parameters, $α_{k+1}$, for the (k+1)-th iteration can also be expressed as:

$$α_{k+1}=α_k+η \cdot M_k^+ \cdot [(\Sigma_{n=1}^N β_n \cdot x_n)-y_k] \quad (1)$$

where $y_k$ is the k-th measurement of the combined receive signal, $M_k$ is the measurement matrix for the non-linear model of the PAs 104, $$M_k^+=(M_k^H \cdot M_k)^{-1} \cdot M_k^H, \quad (2)$$

and $$M_k=[y_k, y_k \cdot |y_k|^2, y_k \cdot |y_k|^4 \cdots\cdots] \quad (3)$$

The predistortion parameters $α_k$ (e.g., complex valued predistortion coefficients) are updated according to the iteration formula (Equation (1)) above.

Note that the above adaptation scheme is only an example. Variations to the adaption scheme described above with respect to FIG. 2 and Equations (1) to (3) may also be used. Further, any other algorithm for minimizing the error (e.g., in a LMS sense) between the combined receive signal and the combined reference signal may be used.

It should also be noted that, in FIG. 2, the solution is written in Matlab notation where the '\'-character means LMS-solution. More specifically, the '\'-character means Pseudoinverse in Matlab language, which is almost the same thing as doing the LMS-procedure. Matlab has provided a convenient way of fast calculation of the LMS, and that is essentially what the '\' character means. Equations (1)-(3) also provide an LMS solution. In this regard, the following notes can be made with respect to FIG. 2 and Equations (1)-(3). The term "$y_{FB}$" is used in FIG. 1 to denote the combination of the individual signals coming from all of the active antenna elements 108 at the receive antenna 114. In FIG. 2, it can be said that $y_{FB}=y$. Further, Y·β means the summation over all signals $y_n$ coming from the different antenna ports. 'Y' is the column matrix of all these signals. Also, one could say that $M_k^+=MAT_k$, but $M_k^+=(M_k^H M_k)^{-1}M^H$ as being the Pseudoinverse to $M_k$. That is, it should be compliant with $M \cdot M^+=I$ (identity matrix), in a Least Means Square sense. Further, X·β in FIG. 2 is equivalent to the term $\Sigma_{n=1}^N β_n \cdot x_n$ in Equation (1). It should also be noted that the exemplary adaptation scheme described above with respect to FIG. 2 and Equations (1) to (3) is outlined in general terms because the unknown parameter α may take on various forms. For example, in some embodiments, the parameter α may express a single scalar, a vector of parameters, or even entries in a LUT. This may be freely set so as to reflect the behavior of the PAs 104 for the desired implementation. In an even more general description of the LMS solution, a single matrix inversion scheme may also be performed as to avoid the iterative implementation.

Thus, it should be understood that the example embodiment of the adaptation scheme of FIG. 2 and Equations (1) to (3) should merely be viewed as an example and that the present disclosure is not limited thereto. The present disclosure focuses on the overall implementation of having just one single receive antenna element 114 and TOR 116 without having the need to implement RF couplers and/or a network routing tree for each of the different feedback signals, in combination with a multitude of linearizers.

Figure 3:
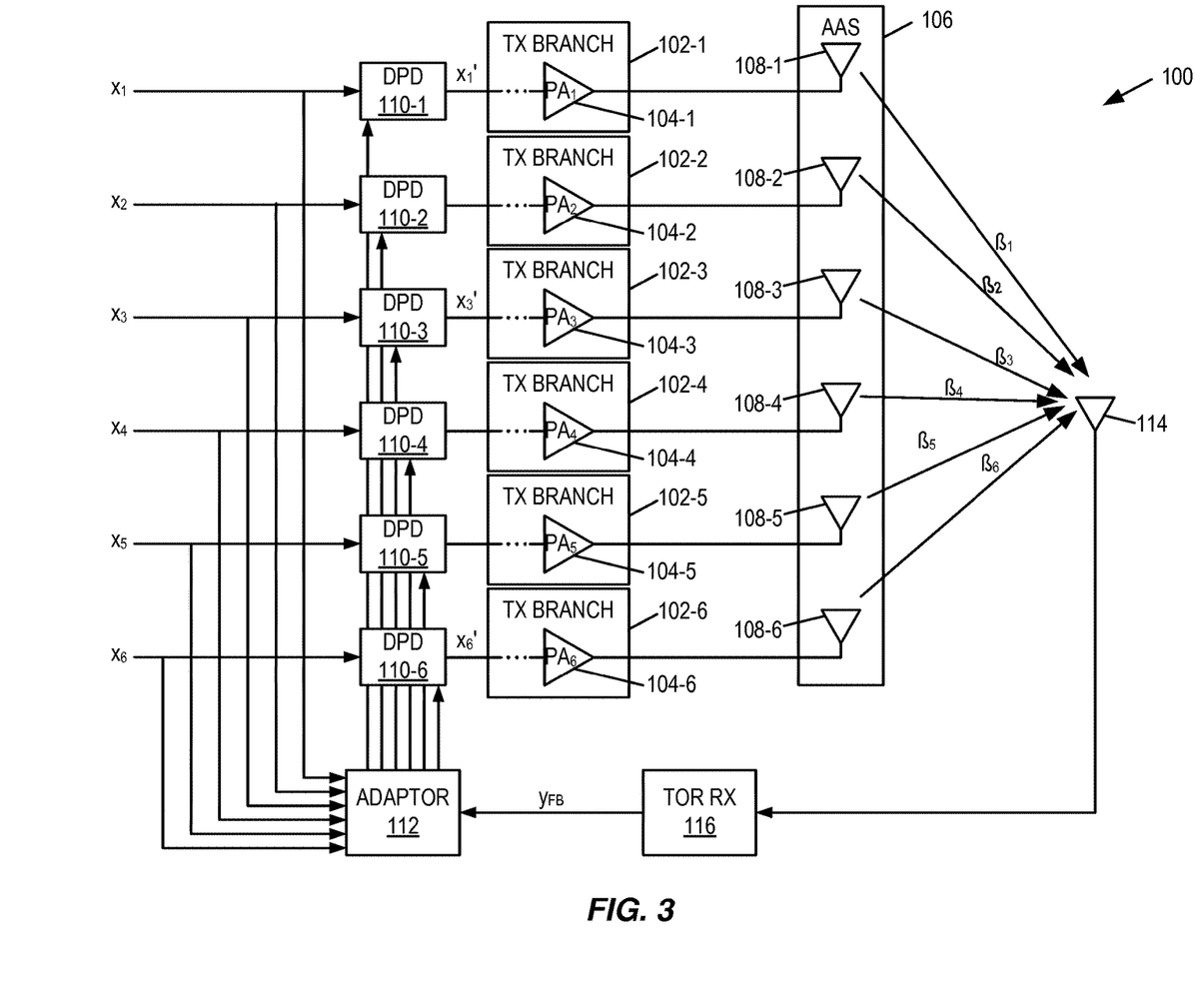
FIG. 3 illustrates a radio system that provides linearization in accordance with some other embodiments of the present disclosure.

Now a number of additional embodiments are described that give additional freedom to the linearization process described above. In this regard, FIG. 3 illustrates the radio system 100 in accordance with another embodiment in which the assumption of all of the PAs 104 having equal non-linear behavior is lifted. Otherwise, the radio system 100 and the operation thereof is the same as that described above. However, since the PAs 104 may have different non-linear characteristics but the same set of predistortion parameters is utilized by all of the DPD predistorters 110, linearization of each of the branches is no longer provided. However, the combined receive signal will still get linearized. That is, although some of the PAs 104 still transmit a relatively high distortion level, the sum of the signal still gets linearized.

Figure 4:
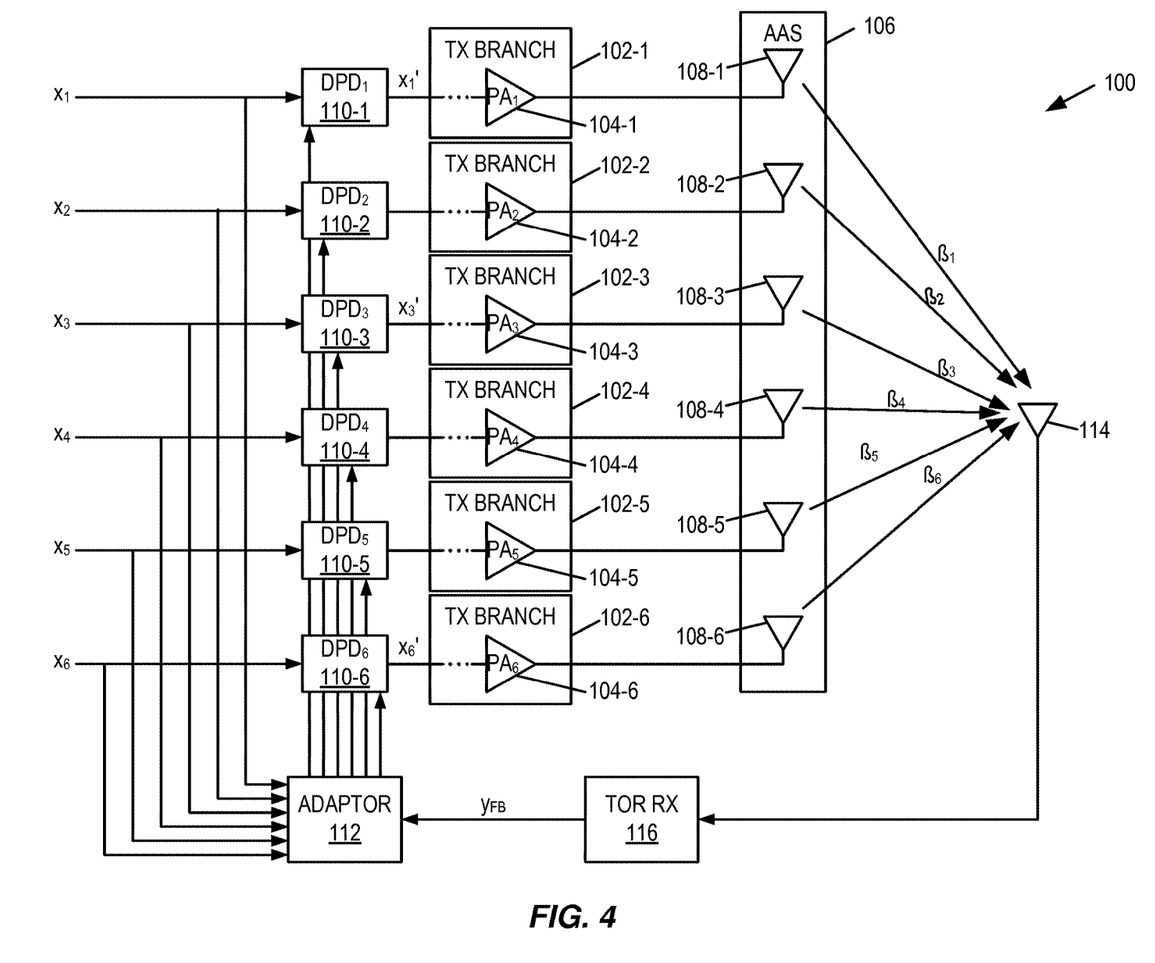
FIG. 4 illustrates a radio system that provides linearization in accordance with some other embodiments of the present disclosure.

FIG. 4 illustrates the radio system 100 in accordance with another embodiment in which the DPD predistorters 110 are configured with different predistortion parameters. In other words, the adaptor 112 generates separate predistortion parameters for the separate DPD predistorters 110. This multiplies the number of unknown parameters to solve for in the adaptor 112 and the convergence ratio of the overall algorithm may be affected. However, it is still possible from an LMS view point to have all the linearizers dedicated to each own non-linear amplifier. In order to extend the algorithm of FIG. 2 and Equations (1) to (3) above to solve for separate coefficients for the DPD predistorters 110, the coefficient vector 'alpha' describing the non-linearity is N times stacked to accommodate for extra coefficients for the additional independent DPD predistorters 110. The gradient matrix M is also extended with additional columns as to take care for the extra unknowns in the LMS optimization procedure.

In yet another embodiment, the embodiment of any one of FIGS. 1 to 4 can be further extended to accommodate unknown coupling factors between the antenna elements 108 and the receive antenna element 114. More specifically, in one example embodiment, an uncertainty factor is introduced. For example, the coupling parameters may be estimated based on, e.g., physical distance between the antenna elements 108 and the receive antenna element 114 with the addition of an uncertainty factor. This will disturb the convergence of the algorithm, but nevertheless it will arrive at a fairly stable solution. In another example embodiment, the coupling parameters are included into the LMS solution as unknowns. Notably, in order to also give provisions for allowing the 'betas' (i.e., the coupling parameters) to be unknown or at least uncertain, one can, in accordance with what is described above about extra DPD coefficients, stack extra beta-unknowns below/above the original alpha vector. That is the unknown iteration vector would be [alpha; beta]. The gradient matrix M is also extended with extra columns corresponding to the derivative with respect to each beta. Then, the approach would be to iterate not only over the alphas, but also over the betas at the same time.

Lastly, it should be noted that while the DPD predistorters 110 and the adaptor 112 are illustrated in FIGS. 1, 3, and 4 as being part of the radio system 100, in some other embodiments, the DPD predistorters 110 and/or the adaptor 112 are implemented external to the radio system 100 such as, e.g., at another device or system or virtualized "in the cloud." In this case, the radio system 100 would, e.g., receive the predistorted transmit signals from the external device/system (e.g., the other device or "cloud") and provide the combined receive signal to the external device/system where it is used to generate (e.g., update) the predistortion parameters of the DPD predistorters 110. As another example, the adaptor 112 is implemented at an external device/system but the DPD predistorters 110 are implemented at the radio system 100, in which case the predistortion parameters input to the DPD predistorters 110 would be received from the external device/system.

Figure 5:
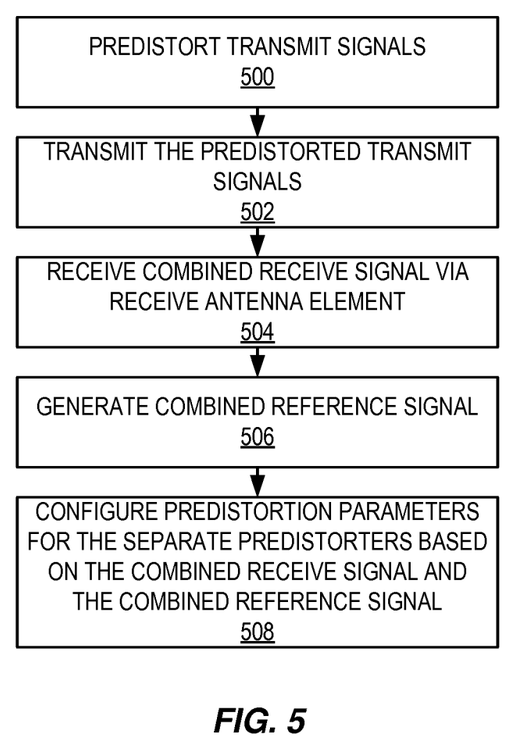
FIG. 5 illustrates a flow chart that illustrates a linearization process in accordance with some embodiments of the present disclosure.

FIG. 5 is a flow chart that illustrates a linearization process in accordance with at least some aspects of the embodiments described above. This process is performed by a radio system such as, e.g., the radio system of FIG. 1, 3, or 4. As such, references to the radio system 100 are included in the description below. As illustrated, the process includes predistorting transmit signals via respective predistorters 110 of the radio system 100 to thereby provide predistorted transmit signals (step 500). The process further includes transmitting the predistorted transmit signals via respective active antenna elements 108 in the antenna array 106 of the radio system 100 (step 502). The process further includes receiving a combined receive signal via the receive antenna element 114 and the TOR 116 of the radio system 100, wherein the combined received signal corresponds to a combination of the transmit signals received at the dedicated antenna element 114 due to coupling between the receive antenna element 114 and the active antenna elements 108 (step 504). The process further comprises generating a combined reference signal based on the transmit signals such that the combined reference signal models the combined receive signal (step 506) and configuring, based on the combined reference signal and the combined receive signal, predistortion parameters input to the predistorters that define predistortion provided by the predistorters (step 508).

In some embodiments, configuring the predistortion parameters comprises configuring the predistortion parameters based on the combined reference signal, the combined receive signal, and known complex valued attenuation factors that define the coupling from the active antenna elements 108 to the receive antenna element 114, as described above. In some embodiments, the predistortion parameters are a common set of predistortion coefficients for the DPD predistorters 110.

As further described above, in some embodiments, the predistortion parameters take the form of an estimated predistortion coefficient vector, $\alpha_{k+1}$, that defines a common set of predistortion coefficients for the DPD predistorters 110, and configuring the predistortion parameters comprises computing the estimated predistortion coefficient vector, $\alpha_{k+1}$, in accordance with:

$$\alpha_{k+1} = \alpha_k + \eta \cdot M_k^+ \cdot \left[ \left( \sum_{n=1}^{N} \beta_n \cdot x_n \right) - y_k \right]$$

where
$\alpha_k$ is a prior set of predistortion parameters at iteration k for the DPD predistorters 110 used to generate the predistorted transmit signals;
$\eta$ is a scaling convergence factor;
$\beta_n$ is the coupling factor between the n-th active antenna element 108 and the receive antenna element 114;
$x_n$ is the transmit signal that is predistorted by the respective DPD predistorter 110 to provide the predistorted transmit signal for the transmit branch 102 for the n-th active antenna element 108;
$y_k$ is the combined receive signal; and $$M_k^+ = (M_k^H \cdot M_k)^{-1} \cdot M_k^H$$

where $$M_k = [y_k, y_k \cdot |y_k|^2, y_k \cdot |y_k|^4 \cdots ]$$

As further described above, in some embodiments, the predistortion parameters comprise a separate set of predistortion coefficients for each of the DPD predistorters 110.

As also described above, in some other embodiments, configuring the predistortion parameters comprises configuring the predistortion parameters based on the combined reference signal, the combined receive signal, and unknown complex valued attenuation factors that define the coupling from the active antenna elements 108 to the receive antenna element 114. Further, in some embodiments, the predistortion parameters take the form of a common set of predistortion coefficients for all of the DPD predistorters 110. In some other embodiments, the predistortion parameters comprise a separate set of predistortion coefficients for each of the DPD predistorters 110.

As further described above, in some embodiments, the receive antenna element 114 is a dedicated antenna element for the TOR 116.

At least some of the following abbreviations may be used in this disclosure. If there is an inconsistency between abbreviations, preference should be given to how it is used above. If listed multiple times below, the first listing should be preferred over any subsequent listing(s).

5G Fifth Generation
AAS Active Antenna System
ADC Analog to Digital Converter
DAC Digital to Analog Converter
DPD Digital Predistortion
FDD Frequency Domain Division
I and Q In-phase and Quadrature phase component
IF Intermediate Frequency
LMS Least Mean Squares
LNA Low Noise Amplifier
LUT Look Up Table
MIMO Multiple Input Multiple Output
PA Power Amplifier
RF Radio Frequency
TDD Time Domain Division
TOR Transmit Observation Receiver Those skilled in the art will recognize improvements and modifications to the embodiments of the present disclosure. All such improvements and modifications are considered within the scope of the concepts disclosed herein.

REFERENCES

[1] CA 2804444 A1, "Method and apparatus to use auxiliary receiver to compensate multiple transmitters based upon one of the transmitters"
[2] EP 3 255 799 A1, "Reducing distortions in amplified signals radiated by a multiple antenna system"
[3] US 20170163217 A1, "Simultaneous Linearization Of Multiple Power Amplifiers With Independent Power," Publication date Jun. 8, 2017

What is claimed is:

1. A radio system, comprising:
an antenna array comprising a plurality of active antenna elements;
a plurality of transmit branches comprising a respective plurality of power amplifiers, the plurality of transmit branches operable to transmit a plurality of predistorted transmit signals via the plurality of active antenna elements, respectively;
a predistortion subsystem comprising a plurality of predistorters for the plurality of transmit branches respectively, the plurality of predistorters operable to predistort a respective plurality of transmit signals to provide the plurality of predistorted transmit signals and provide the plurality of predistorted transmit signals to the plurality of transmit branches, respectively;
a receive antenna element;
a transmit observation receiver having an input coupled to the receive antenna element, the transmit observation receiver operable to receive, via the receive antenna element, a combined receive signal; and
an adaptor operable to:
generate a combined reference signal based on the plurality of transmit signals such that the combined reference signal models the combined receive signal; and
configure predistortion parameters input to the plurality of predistorters that define predistortion provided by the plurality of predistorters based on the combined reference signal, the combined receive signal, and known complex valued attenuation factors that define the coupling from the plurality of active antenna elements to the receive antenna element;
wherein:
the predistortion parameters are an estimated predistortion coefficient vector, $\alpha_{k+1}$, that defines a common set of predistortion coefficients for the plurality of predistorters; and
in order to configure the predistortion parameters, the adaptor is further configured to compute the estimated predistortion coefficient vector, $\alpha_{k+1}$, in accordance with:

$$\alpha_{k+1} = \alpha_k + \eta \cdot M_k^+ \cdot [(\Sigma_{n=1}^N \beta_n \cdot x_n) - y_k]$$

where $\alpha_k$ is a prior set of predistortion parameters for the plurality of predistorters used to generate the plurality of predistorted transmit signals;
$\eta$ is a scaling convergence factor;
$\beta_n$ is a coupling factor between the n-th active antenna element and the receive antenna element;
$x_n$ is the transmit signal that is predistorted by the respective predistorter to provide the predistorted transmit signal for the transmit branch for the n-th active antenna element;
$y_k$ is the combined receive signal; and $$M_k^+ = (M_k^H \cdot M_k)^{-1} \cdot M_k^H$$

where $M_k = [y_k, y_k \cdot |y_k|^2, y_k \cdot |y_k|^4 \cdots]$, which is a measurement matrix for a non-linear model of a power amplifier.

2. The radio system of claim 1 wherein the receive antenna element is a dedicated antenna element for the transmit observation receiver.

3. A method of operation of a radio system to linearize the radio system, comprising:
predistorting a plurality of transmit signals via a respective plurality of predistorters of the radio system to thereby provide a plurality of predistorted transmit signals;
transmitting the plurality of predistorted transmit signals via a respective plurality of active antenna elements in an antenna array of the radio system;
receiving a combined receive signal via a receive antenna;
generating a combined reference signal based on the plurality of transmit signals such that the combined reference signal models the combined receive signal; and
configuring, based on the combined reference signal, the combined receive signal, and known complex valued attenuation factors that define the coupling from the plurality of active antenna elements to the receive antenna element, predistortion parameters input to the plurality of predistorters that define predistortion provided by the plurality of predistorters;
wherein:
the predistortion parameters are an estimated predistortion coefficient vector, $\alpha_{k+1}$, that defines a common set of predistortion coefficients for the plurality of predistorters; and
configuring the predistortion parameters comprises compute the estimated predistortion coefficient vector, $a_{k+1}$, in accordance with:

$$\alpha_{k+1} = \alpha_k + \eta \cdot M_k^+ \cdot [(\Sigma_{n=1}^N \beta_n \cdot x_n) - y_k]$$

where
$\alpha_k$ is a prior set of predistortion parameters for the plurality of predistorters used to generate the plurality of predistorted transmit signals;
$\eta$ is a scaling convergence factor;

$\beta_n$ is a coupling factor between the n-th active antenna element and the receive antenna element;

$x_n$ is the transmit signal that is predistorted by the respective predistorter to provide the predistorted transmit signal for the transmit branch for the n-th active antenna element;

$y_k$ is the combined receive signal; and $$M_k^+ = (M_k^H \cdot M_k)^{-1} \cdot M_k^H$$

where $M_k = [y_k\, y_k \cdot |y_k|^2\, y_k \cdot |y_k|^4 \bullet\bullet\bullet\bullet\bullet\bullet]$, which is a measurement matrix for a non-linear model of a power amplifier.

4. The method of claim 3 wherein the receive antenna element is a dedicated antenna element for a transmit observation receiver used for receiving the combined receive signal.

5. A base station for a wireless communication system, the base station comprising a radio system comprising:
  an antenna array comprising a plurality of active antenna elements;
  a plurality of transmit branches comprising a respective plurality of power amplifiers, the plurality of transmit branches operable to transmit a plurality of predistorted transmit signals via the plurality of active antenna elements, respectively;
  a predistortion subsystem comprising a plurality of predistorters for the plurality of transmit branches respectively, the plurality of predistorters operable to predistort a respective plurality of transmit signals to provide the plurality of predistorted transmit signals and provide the plurality of predistorted transmit signals to the plurality of transmit branches, respectively;
  a receive antenna element;
  a transmit observation receiver having an input coupled to the receive antenna element, the transmit observation receiver operable to receive, via the receive antenna element, a combined receive signal; and
  an adaptor operable to:
    generate a combined reference signal based on the plurality of transmit signals such that the combined reference signal models the combined receive signal; and
    configure predistortion parameters input to the plurality of predistorters that define predistortion provided by the plurality of predistorters based on the combined reference signal, the combined receive signal, and known complex valued attenuation factors that define the coupling from the plurality of active antenna elements to the receive antenna element;
  wherein:
    the predistortion parameters are an estimated predistortion coefficient vector, $\alpha_{k+1}$, that defines a common set of predistortion coefficients for the plurality of predistorters; and
    in order to configure the predistortion parameters, the adaptor is further configured to compute the estimated predistortion coefficient vector, $\alpha_{k+1}$, in accordance with:

$$\alpha_{k+1} = \alpha_k + \eta \cdot M_k^+ \cdot \left[ \left( \sum_{n=1}^{N} \beta_n \cdot x_n \right) - y_k \right]$$

where $\alpha_k$ is a prior set of predistortion parameters for the plurality of predistorters used to generate the plurality of predistorted transmit signals;

$\eta$ is a scaling convergence factor;

$\beta_n$ is a coupling factor between the n-th active antenna element and the receive antenna element;

$x_n$ is the transmit signal that is predistorted by the respective predistorter to provide the predistorted transmit signal for the transmit branch for the n-th active antenna element;

$y_k$ is the combined receive signal; and $$M_k^+ = (M_k^H \cdot M_k)^{-1} \cdot M_k^H$$

where $M_k = [y_k\, y_k \cdot |y_k|^2\, y_k \cdot |y_k|^4 \bullet\bullet\bullet\bullet\bullet\bullet]$, which is a measurement matrix for a non-linear model of a power amplifier.

\* \* \* \* \*

UNITED STATES PATENT AND TRADEMARK OFFICE
CERTIFICATE OF CORRECTION

PATENT NO. : 11,563,408 B2
APPLICATION NO. : 17/293676
DATED : January 24, 2023
INVENTOR(S) : Rexberg et al.

It is certified that error appears in the above-identified patent and that said Letters Patent is hereby corrected as shown below:

In the Specification

In Column 7, Line 56, delete "though" and insert -- through --, therefor.

In Column 8, Line 4, delete "though" and insert -- through --, therefor.

In Column 9, Lines 50-51, in Equation (1), delete "$\alpha_{k+1} = \alpha_k + \eta \cdot M_k^+ \cdot [(\Sigma_{n=1}^{N} \beta_n \cdot x_n) - y_k]$," and insert -- $\alpha_{k+1} = \alpha_k + \eta \cdot M_k^+ \cdot \left[\left(\sum_{n=1}^{N} \beta_n \cdot x_n\right) - y_k\right]$ --, therefor.

In Column 10, Line 22, delete "$\Sigma_{n=1}^{N} \beta_n \cdot x_n$" and insert -- $\sum_{n=1}^{N} \beta_n \cdot x_n$ --, therefor.

In Column 12, Line 32, delete "$\beta_n$," and insert -- $\beta_n$ --, therefor.

In Column 12, Line 34, delete "$x_n$," and insert -- $x_n$ --, therefor.

In the Claims

In Column 14, Line 10, in Claim 1, delete "$\alpha_{k+1} = \alpha_k + \eta \cdot M_k^+ \cdot [(\Sigma_{n=1}^{N} \beta_n \cdot x_n) - y_k]$," and insert Signed and Sealed this
Sixth Day of June, 2023

*Katherine Kelly Vidal*
Katherine Kelly Vidal
*Director of the United States Patent and Trademark Office*

CERTIFICATE OF CORRECTION (continued)
U.S. Pat. No. 11,563,408 B2

-- $$\alpha_{k+1} = \alpha_k + \eta \cdot M_k^+ \cdot \left[\left(\sum_{n=1}^{N} \beta_n \cdot x_n\right) - y_k\right]$$ --, therefor.

In Column 14, Lines 11-13, in Claim 1, delete "$\alpha_k$ is a prior set of predistortion parameters for the plurality of predistorters used to generate the plurality of predistorted transmit signals;" and insert the same at Line 12 as a new sub-point.

In Column 14, Line 14, in Claim 1, delete "ηis" and insert -- η is --, therefor.

In Column 14, Line 60, in Claim 3, delete "$a_{k+i}$," and insert -- $\alpha_{k+1}$, --, therefor.

In Column 14, Line 62, in Claim 3, delete "$\alpha_{k+1} = \alpha_k + \eta \cdot M_k^+ \cdot [(\Sigma_{n=1}^{N} \beta_n \cdot x_n) - y_k]$," and insert -- $$\alpha_{k+1} = \alpha_k + \eta \cdot M_k^+ \cdot \left[\left(\sum_{n=1}^{N} \beta_n \cdot x_n\right) - y_k\right]$$ --, therefor.